United States Patent
Bhavnagarwala et al.

(10) Patent No.: US 9,947,402 B1
(45) Date of Patent: Apr. 17, 2018

(54) METHOD, SYSTEM AND DEVICE FOR NON-VOLATILE MEMORY DEVICE OPERATION

(71) Applicant: ARM Ltd., Cambridge (GB)

(72) Inventors: Azeez Jennudin Bhavnagarwala, Newtown, CT (US); Vivek Asthana, Greater Noida (IN); Piyush Agarwal, Noida (IN); Akshay Kumar, New Delhi (IN); Lucian Shifren, San Jose, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/443,960

(22) Filed: Feb. 27, 2017

(51) Int. Cl.
*G11C 13/00* (2006.01)
*H01L 27/24* (2006.01)

(52) U.S. Cl.
CPC ........ *G11C 13/0069* (2013.01); *G11C 13/004* (2013.01); *G11C 13/0004* (2013.01); *G11C 13/0007* (2013.01); *G11C 13/0011* (2013.01); *G11C 13/0097* (2013.01); *H01L 27/2436* (2013.01)

(58) Field of Classification Search
CPC ............ G11C 13/0069; G11C 13/0002; G11C 13/0011; G11C 13/0026; G11C 2013/0083; G11C 11/5678; G11C 13/004; G11C 13/0007; G11C 13/0097; G11C 11/1673; G11C 2013/0078; H01L 27/2436; H01L 45/146
USPC ............... 365/148, 158, 163, 189.15, 189.16
See application file for complete search history.

(56) References Cited

U.S. PATENT DOCUMENTS

| | | | |
|---|---|---|---|
| 6,950,331 B2 * | 9/2005 | Yang | B82Y 10/00 365/100 |
| 7,298,640 B2 | 11/2007 | Chen et al. | |
| 7,345,907 B2 * | 3/2008 | Scheuerlein | G11C 13/0011 365/100 |
| 7,639,523 B2 | 12/2009 | Celinska et al. | |
| 7,778,063 B2 | 8/2010 | Brubaker et al. | |
| 7,872,900 B2 * | 1/2011 | Paz de Araujo | H01L 45/04 365/148 |
| 8,902,634 B2 * | 12/2014 | Iwayama | H01L 43/08 257/421 |
| 9,558,819 B1 | 1/2017 | Aitken et al. | |
| 9,584,118 B1 | 2/2017 | Dao et al. | |
| 9,589,636 B1 | 3/2017 | Bhavnagarwala et al. | |
| 9,627,615 B1 | 4/2017 | Reid et al. | |
| 2008/0106926 A1 | 5/2008 | Brubaker | |
| 2008/0107801 A1 | 5/2008 | Celinska et al. | |
| 2011/0128773 A1 * | 6/2011 | Azuma | G11C 13/0007 365/148 |
| 2013/0200323 A1 | 8/2013 | Pham et al. | |
| 2013/0214232 A1 | 8/2013 | Tendulkar et al. | |

(Continued)

*Primary Examiner* — Tan T. Nguyen
(74) *Attorney, Agent, or Firm* — Berkeley Law & Technology Group, LLP

(57) ABSTRACT

Disclosed are methods, systems and devices for operation of non-volatile memory devices. In one aspect, a correlated electron switch (CES) device may be placed in any one of multiple memory states in a write operation. Limiting current between terminals of the non-volatile memory device during read operations may enable use of higher voltages for higher realized gain. Additionally, bipolar write operations for set and reset may enable an increased write window and enhanced durability for a CES device.

15 Claims, 7 Drawing Sheets

(56) References Cited

U.S. PATENT DOCUMENTS

| | | |
|---|---|---|
| 2013/0285699 A1* | 10/2013 | McWilliams ........ H03K 19/173 |
| | | 326/41 |
| 2016/0163978 A1 | 6/2016 | Paz De Araujo et al. |
| 2017/0033782 A1 | 2/2017 | Shifren et al. |
| 2017/0045905 A1 | 2/2017 | Sandhu et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |

\* cited by examiner

METHOD, SYSTEM AND DEVICE FOR NON-VOLATILE MEMORY DEVICE OPERATION

BACKGROUND

1. Field

Disclosed are techniques for utilizing memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for speed and higher bit density.

More recently, FeRAMs (Ferroelectric RAMs) have provided low power, relatively high write/read speed, and endurance for read/write cycles exceeding 10 billion times. Similarly, magnetic memories (MRAMs) have provided high write/read speed and endurance, but with a high cost premium and higher power consumption. Neither of these technologies reaches the density of flash memory devices, for example. As such, flash remains a non-volatile memory of choice. Nevertheless, it is generally recognized that flash memory technology may not scale easily below 65 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_e$, with x, y, z and e of varying stoichiometry; transition metal oxides, such as CuO, CoO, $VO_x$, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments are still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

Given an inherent difficulty in forming a thin film resistance switching material that is stable over time and temperature, a workable resistance switching memory remains a challenge. Furthermore, all resistance switching mechanisms developed up to now have been inherently unsuitable for memories, due to high currents, electroforming, no measurable memory read or write windows over a reasonable range of temperatures and voltages, and many other problems such as stochastic behavior. Thus, there remains a need in the art for a non-volatile memory that is deterministic has low power, high speed, high density and stability, and in particular, such a memory that is scalable to feature sizes well below 65 nanometers (nm).

DETAILED DESCRIPTION

Figure 1A:
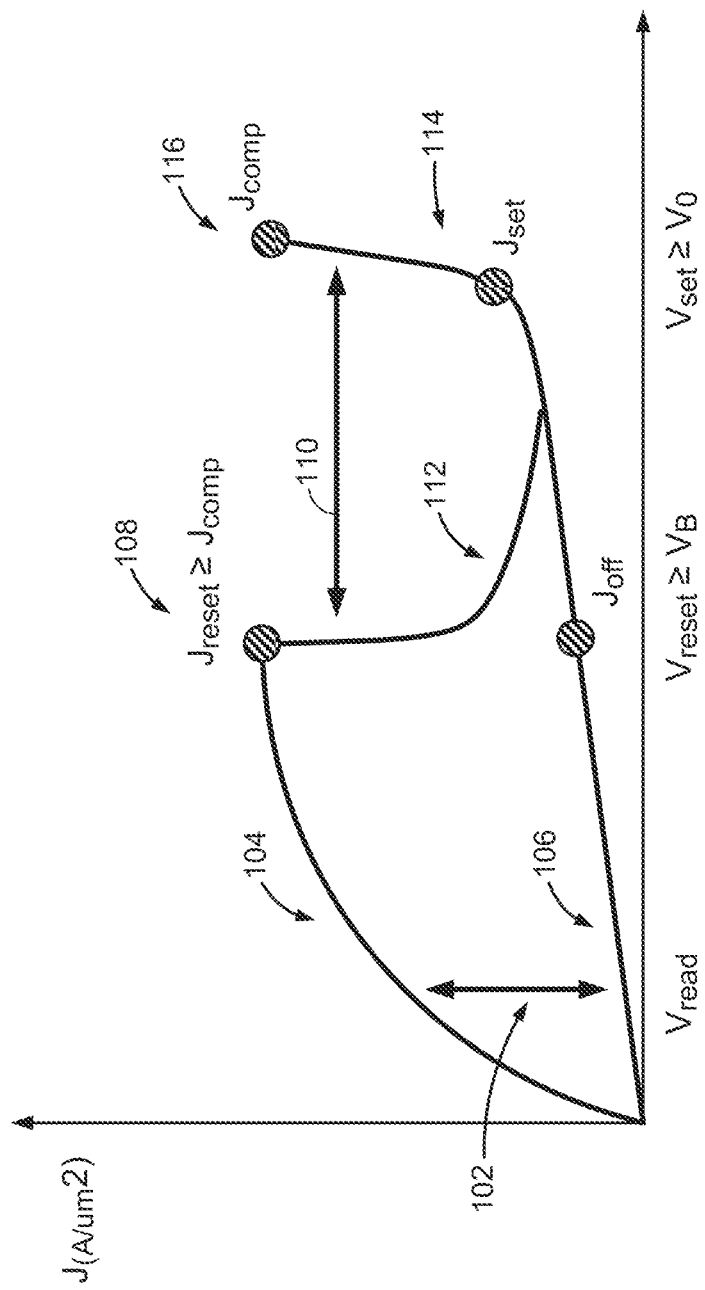
FIG. 1A shows a plot of current density versus voltage for a CES device according to an embodiment.

Particular aspects of the present disclosure incorporate a Correlated Electron Material (CEM) to form a correlated electron switch (CES). In this context, a CES may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES between an insulative state and a conductive state may be understood in terms of a Mott transition. In a Mott transition, a material may switch from an insulative state to conductive state if a Mott transition condition occurs. The criteria may be defined by the condition $(n_C)^{1/3} a=0.26$, where $n_C$ is a concentration of electrons and "a" is a Bohr radius. If a critical carrier concentration is achieved such that the Mott criteria is met, a Mott transition may occur and state may change from a high resistance/capacitance to a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In particular implementations of aspects of this disclosure, a resistive switching integrated circuit memory may comprise: a resistive switching memory cell including a CES device; a write circuit for placing the resistive switching memory cell in a first resistive state or a second resistive state depending on signals provided to the memory cell, wherein a resistance of the CES is higher in the second resistance state than in the first resistance state; and a read circuit for sensing the state of the memory cell and providing an electrical signal corresponding to the sensed state of the memory cell. In one aspect, a resistance of a CES in the second memory cell state may be more than 100 times the resistance in the second memory cell state. In a particular implementation, a CES device may switch resistive states responsive to a Mott-transition in the majority of the volume of the CES device. In one aspect, a CES device may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES device may be formed as a "CEM random access memory (CeRAM)" device. In this context, a CeRAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative memory states. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative) than while the memory device in a second memory state referred to as a conductive or low impedance memory state.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1A shows a plot of current density versus voltage across terminals (not shown) for a CES device according to an embodiment. Based, at least in part, on a voltage applied to terminals of the CES device (e.g., in a write operation), the CES may be placed in a conductive state or an insulative state. For example application of a voltage $V_{set}$ and current density $J_{set}$ may place the CES device in a conductive memory state and application of a voltage $V_{reset}$ and a current density $J_{reset}$ may place the CES device in an insulative memory state. Following placement of the CES in an insulative state or conductive memory state, the particular state of the CES device may be detected by application of a voltage $V_{read}$ (e.g., in a read operation) and detection of a current or current density at terminals of the CeRAM device.

According to an embodiment, the CES device of FIG. 1A may include any TMO, such as, for example, perovskites, Mott insulators, charge exchange insulators, and Anderson disorder insulators. In particular implementations, a CES device may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES device may be prepared without electroforming. Other implementations may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from claimed subject matter.

In one aspect, the CES device of FIG. 1A may comprise materials that are TMO metal oxide variable resistance materials, though it should be understood that these are exemplary only, and are not intended to limit claimed subject matter. Particular implementations may employ other variable resistance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences. In another particular example, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES device may rapidly switch from a conductive state to an insulator state via the Mott transition. This may occur at point 108 of the plot in FIG. 1A. At this point, electrons are no longer screened and become localized. This correlation may result in a strong electron-electron interaction potential which splits the bands to form an insulator. While the CES device is still in the insulative state, current may generated by transportation of electron holes. If enough bias is applied across terminals of the CES, electrons may be injected into a metal-insulator-metal (MIM) diode over the potential barrier of the MIM device. If enough electrons have been injected and enough potential is applied across terminals to place the CES device in a set state, an increase in electrons may screen electrons and remove a localization of electrons, which may collapse the band-splitting potential forming a metal.

According to an embodiment, current in a CES device may be controlled by an externally applied "compliance" condition determined based, at least in part, on the external current limited during a write operation a write operation to place the CES device in an insulative state. This externally applied compliance current may also set a condition of a current density for a subsequent reset operation to place the CES in a conductive state. As shown in the particular implementation of FIG. 1A, a current density J$_{comp}$ applied during a write operation at point 116 to place the CES device in an insulative state may determine a compliance condition for placing the CES device in a conductive state in a subsequent write operation. As shown, the CES device may be subsequently placed in a conductive state by application of a current density J$_{reset}$≥J$_{comp}$ at a voltage V$_{reset}$ at point 108, where J$_{comp}$ is externally applied.

The compliance condition therefore may determine a number of electrons in a CES device which are to be "captured" by holes for the Mott transition. In other words, a current applied in a write operation to place a CES device in a conductive memory state may determine a number of holes to be injected to the CES device for subsequently transitioning the CES device to an insulative memory state.

As pointed out above, a reset condition may occur in response to a Mott transition at point 108. As pointed out above, such a Mott transition may occur at condition in a CES device in which a concentration of electrons n equals a concentration of electron holes p. This condition may be modeled according to expression (1) as follows:

$$\lambda_{TF} n^{\frac{1}{3}} = C \sim 0.26 \qquad (1)$$

$$n = \left(\frac{C}{\lambda_{TF}}\right)^3$$

where:
$\lambda_{TF}$ is a Thomas Fermi screening length; and
C is a constant.

According to an embodiment, a current or current density in a region 104 of the plot shown in FIG. 1A may exist in response to injection of holes from a voltage signal applied across terminals of a CES device. Here, injection of holes may meet a Mott transition criterion for the conductive state to insulative state transition at current I$_{MI}$ as a critical voltage V$_{MI}$ is applied across terminals of CES device. This may be modeled according to expression (3) as follows:

$$I_{MI}(V_{MI}) = \frac{dQ(V_{MI})}{dt} \approx \frac{Q(V_{MI})}{t} \qquad (3)$$

$$Q(V_{MI}) = qn(V_{MI})$$

Where Q(V$_{MI}$) is the charged injected (hole or electron) and is a function of an applied voltage.

Injection of electron holes to enable a Mott transition may occur between bands and in response to critical voltage V$_{MI}$, and critical current I$_{MI}$. By equating electron concentration n with a charge concentration to bring about a Mott transition by holes injected by I$_{MI}$ in expression (3) according to expression (1), a dependency of such a critical voltage V$_{MI}$ on Thomas Fermi screening length $\lambda_{TF}$ may be modeled according to expression (4) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (4)$$

$$J_{reset}(V_{MI}) = J_{MI}(V_{MI}) = \frac{I_{MI}(V_{MI})}{A_{CeRam}} = \frac{q}{A_{CeRam} t}\left(\frac{C}{\lambda_{TF}(V_{MI})}\right)^3$$

Where:
A$_{CeRam}$ is a cross-sectional area of a CES element; and
J$_{reset}$(V$_{MI}$) is a current density through the CES element to be applied to the CES element at a critical voltage V$_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria.

In transitioning a CES to a conductive memory state, as enough electrons have been injected and the potential across terminal of the CES device overcomes a critical switching potential (e.g., $V_{set}$), injected electrons begin to screen and unlocalize double-occupied electrons to reverse a disproportion reaction and closing the bandgap. A current density $J_{set}(V_{MI})$ for transitioning the CES to the conductive memory state at a critical voltage $V_{MI}$ enabling transition to the conductive memory state may be expressed according to expression (6) as follows:

$$I_{IM}(V_{IM}) = \frac{dQ(V_{IM})}{dt} \approx \frac{Q(V_{IM})}{t} \qquad (6)$$

$$Q(V_{IM}) = qn(V_{IM})$$

$$I_{IM}(V_{IM}) = \frac{Q(V_{IM})}{t} = \frac{qn(V_{IM})}{t} = \frac{q}{t}\left(\frac{C}{a_B}\right)^3$$

$$J_{set}(V_{IM}) = J_{injection}(V_{IM}) = J_{IM}(V_{IM}) = \frac{I_{IM}(V_{IM})}{A_{CeRam}} = \frac{q}{A_{CeRam}t}\left(\frac{C}{a_B}\right)^3$$

where:

AB is a Bohr radius.

According to an embodiment, a "read window" 102 for detecting a memory state of a CES device in a read operation may be set out as a difference between a portion 106 the plot of FIG. 1A while the CES device is in an insulative state and a portion 104 of the plot FIG. 1A while the CES device is in a conductive state at a read voltage $V_{read}$. In a particular implementation, read window 102 may be used to determine a Thomas Fermi screening length $\lambda_{TF}$ of material making up the CES device. For example, at a voltage $V_{reset}$, current densities $J_{reset}$ and $J_{set}$ may be related to according to expression (7) as follows:

$$\lambda_{TF}(@V_{reset}) = a_B\left(\frac{J_{reset}}{J_{off}}\right)^{\frac{1}{3}} \qquad (7)$$

In another embodiment, a "write window" 110 for placing a CES device in an insulative or conductive memory state in a write operation may be set out as a difference between $V_{reset}$ (at $J_{reset}$) and $V_{set}$ (at $J_{set}$). Establishing $|V_{set}|>|V_{reset}|$ enables a switch between conductive and insulative state. $V_{reset}$ may be approximately at a band splitting potential arising from correlation and $V_{set}$ may be approximately twice the band splitting potential. In particular implementations, a size of write window 110 may be determined, at least in part, by materials and doping of the CES device.

Figure 1B:
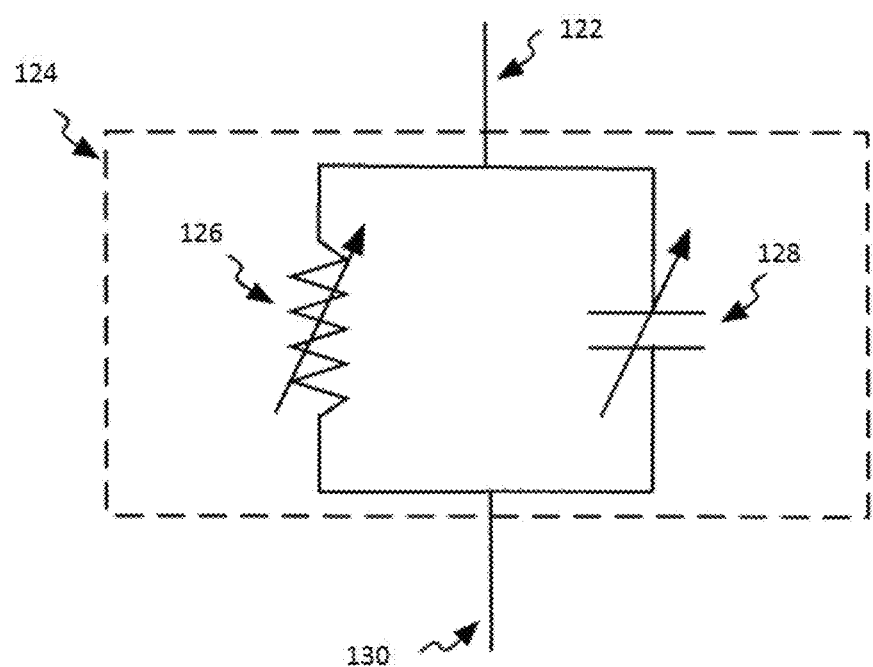
FIG. 1B is a schematic diagram of an equivalent circuit to a CES device according to an embodiment.

The transition from high resistance/capacitance to low resistance/capacitance in a CES device may be represented by a singular impedance of the CES device. FIG. 1B depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Of course, although a variable resistor 126 and variable capacitor 128 are depicted in FIG. 1B as comprising discrete components, a variable impeder device, such as variable impeder device 124, may comprise a substantially homogenous CEM, wherein the CEM comprises characteristics of variable capacitance and variable resistance. Table 1 below depicts an example truth table for an example variable impeder device, such as variable impeder device 100.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

Figure 2:
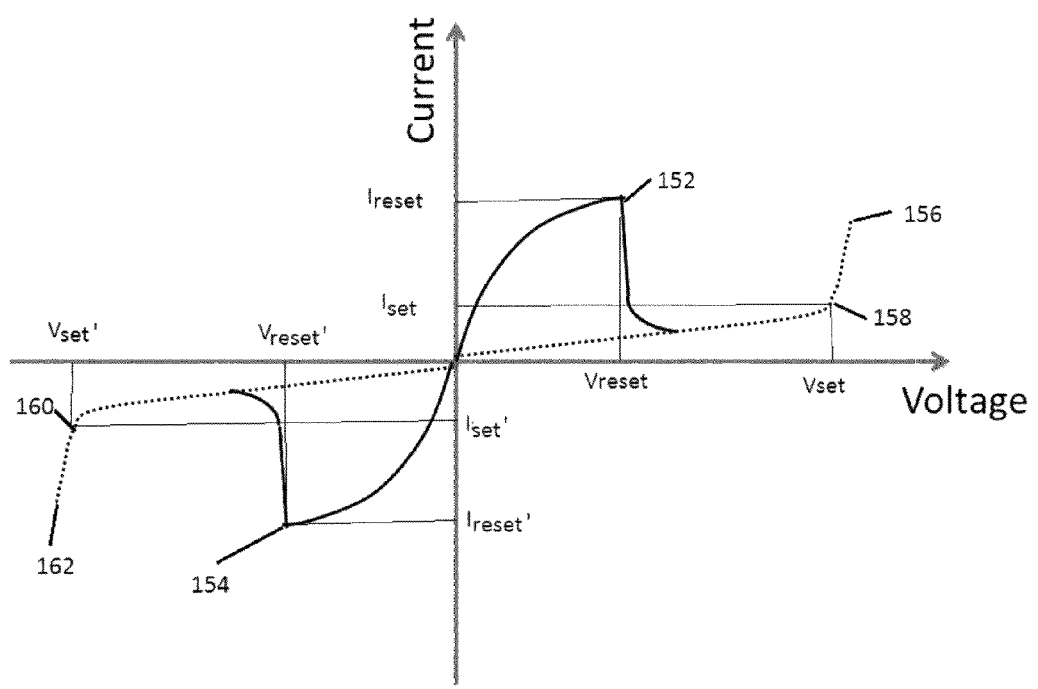
FIG. 2 is a plot illustrating symmetrical operation of a CES device according to an embodiment.

As may be observed from the plot of FIG. 1A, a programming signal to place a CES in a low impedance or conductive state may satisfy a set voltage condition having a positive polarity and a set current condition having a positive polarity. Likewise a programming signal to place a CES in a high impedance or insulative state may satisfy a reset voltage condition having a positive polarity and a reset current condition having a positive polarity. In particular embodiments, as illustrated in FIG. 2, a write operation may be performed by meeting alternative voltage and current conditions in different polarities. In this context, operation in the voltage versus current plot of FIG. 2 with current and voltage both having a positive polarity places operation in the first quadrant while operation with current and voltage having a negative polarity places operation in the third quadrant. For example, point 158 may define a first set voltage condition of $V_{set}$ and a first set current condition $I_{set}$ in a first quadrant while point 160 may define a second set voltage condition of $V_{set}'$ and a second set current condition $I_{set}'$ in a third quadrant. In other words a particular CES device having operational characterized by the plot of FIG. 2 may be placed in a low impedance or conductive state by application of a programming signal having a voltage $V_{set}$ and a current $I_{set}$ (at point 158), or by application of a programming signal having a voltage $V_{set}'$ and a current $I_{set}'$ (at point 160).

Likewise, point 152 may define a first reset voltage condition of $V_{reset}$ and a first reset current condition $I_{reset}$ in a first quadrant while point 154 may define a second reset voltage condition of $V_{reset}'$ and a second reset current condition $I_{reset}'$ in a third quadrant. In other words a particular CES device having operational characterized by the plot of FIG. 2 may be placed in a high impedance or insulative state by application of a programming signal having a voltage $V_{reset}$ and a current $I_{reset}$ (at point 152), or by application of a programming signal having a voltage $V_{reset}'$ and a current $I_{reset}'$ (at point 154). Here, first and second reset current conditions $I_{reset}$ and $I_{reset}'$ may be determined based on a magnitude of a compliance current applied in a previous set operation at either point 156 or 162.

In the particular embodiment of FIG. 2, a CES device may be characterized as having symmetric voltage and current conditions for write operations to place the CES in a particular impedance state. Here, as discussed above, first set voltage and current conditions ($V_{set}$ and $I_{set}$) are symmetric with second set voltage and current conditions ($V_{set}'$ and $I_{set}'$) in that $|V_{set}|\approx|V_{set}'|$ and $|I_{set}|\approx|I_{set}'|$. Likewise, first reset voltage and current conditions ($V_{reset}$ and $I_{reset}$) are symmetric with second set voltage and current conditions ($V_{reset}'$ and $I_{reset}'$) in that $|V_{reset}|\approx|V_{reset}'|$ and $|I_{reset}|\approx|I_{reset}'|$. In this context, symmetric voltage conditions for a particular write operation are polar opposite voltages of substantially the same magnitude. Similarly, symmetric current conditions for a particular write operation are polar opposite currents of substantially the same magnitude. The particular implementation of FIG. 2 illustrates operations on a CES device that are symmetric and bipolar in a current versus voltage plot. Other examples illustrated below with reference to FIGS. 5A through 5E show read and write operations on a CES device that are symmetric and bipolar in a current versus voltage plot. It should be understood, however, that read and write operations on a CES device may be bipolar in a current versus voltage plot without being symmetric, and that claimed subject matter is not limited to read and write operations on a CES device that are symmetric.

FIG. 2 illustrates that aspects of operations to place a CES element in a particular state may occur in either a first quadrant ($V_{set}$ and $I_{set}$ or $V_{reset}$ and $I_{reset}$) or a third quadrant ($V_{set}'$ and $I_{set}'$ or $V_{reset}'$ and $I_{reset}'$). According to an embodiment, and as discussed below, a bitcell incorporating a CES element having properties illustrated in FIG. 2 may perform bi-polar write operations such that set and reset operations occur in opposite quadrants. For example, a bitcell may perform write operations to place the CES element in a high impedance or insulative state by applying a first programming signal as $V_{reset}$ and $I_{reset}$ (in the first quadrant) and to place the CES element in a low impedance or conductive state by applying a second programming signal as $V_{set}'$ and $I_{set}'$ (in the third quadrant). By performing set and reset operations in opposite quadrants, a write window as $V_{set}-V_{reset}$ as shown in FIG. 1A may be increased to $|V_{set}'|+|V_{reset}|$. Alternatively, a bitcell may perform write operations to place the CES element in a high impedance or insulative state by applying a first programming signal as $V_{reset}'$ and $I_{reset}'$ (in the third quadrant) and to place the CES element in a low impedance or conductive state by applying a second programming signal as $V_{set}$ and $I_{set}$ (in the first quadrant). This similarly may expand a write window as $V_{set}-V_{reset}$ as shown in FIG. 1A to may be increased to $|V_{set}|+|V_{reset}'|$.

In addition to expanding a write window employing bi-polar write operations, bi-polar operation allows reversing flow of current through TMO material forming the CES element. As discussed below, this may be accomplished without multiple power supplies or negative voltages. Reversing current flow through TMO material in a CES element in different operations may extend the durability of the CES element subjected to multiple repetitive read and write operations over the life of a product incorporating the CES element. In a particular implementation as discussed below, over the life of a product a bitcell may apply a read signal for read operations in a first polarity and one or both programming signals in a second polarity opposite the first polarity.

For example, a bitcell and peripheral read circuit may be configured to apply a read signal to a CES element for any read operation in a first polarity. The bitcell and write driver circuit may then be configured to apply a programming signal for a particular write operation (e.g., for either a set or reset operation) to the CES element in a second polarity (opposite the first polarity) for any instance of the particular write operation. It should be understood, however, that this is merely example of read operations applied to a CES element that may have a polarity different from a polarity write operations applied to the CES element, and claimed subject matter is not limited in this respect.

In another example, a bitcell and write driver circuit may be configured to apply a programming signal for a first write operation (e.g., for a set operation) to the CES element in a first polarity for any instance of the first write operation. The bitcell and write driver circuit may then be configured to apply a second programming signal for a second write operation (e.g., for a reset operation) to the CES element in a second polarity (which is opposite the first polarity) for any instance of the second write operation. It should be understood, however, that this is merely example of instance of a first write operation applied to a CES element that may have a polarity different from a polarity a second write operation applied to the CES element, and claimed subject matter is not limited in this respect.

As shown in FIG. 1A, a read voltage $V_{read}$ may be applied in a read operation to detect the state of the CES as being in a high impedance or insulative state, or in a low impedance or conductive state. In other embodiments, a read voltage may be applied in either a first quadrant (e.g., as shown in FIG. 1A), alternatively, in a third quadrant. In a particular implementation, a read signal applied to a CES in a read operation may have a voltage polarity that is opposite of a polarity of a voltage of programming signal applied in a write operation. For example, such a read voltage may have a polarity that is opposite to a polarity of voltage of a first programming signal (e.g., $V_{set}$ or $V_{set}'$), opposite to a polarity of a voltage of a second programming signal (e.g., $V_{reset}$ or $V_{reset}'$), or both. This may further enhance durability and extend reliable use of the CES.

As pointed out above in connection with the particular embodiment of FIG. 1A, a read voltage $V_{read}$ applied in a read operation may be maintained to be below $V_{reset}$ so as to prevent change of a state of the CES element from a low impedance or conductive state to a high impedance of insulative state in a read operation. In a particular implementation, a peripheral read circuit (e.g., sense amplifier 303) generating a read signal may limit current through the CES in a read operation so as to allow a magnitude of a read supply voltage to exceed $|V_{reset}|$ or $|V_{reset}'|$ without changing a state of the CES element from a low impedance or conductive state to a high impedance of insulative state. This may allow a higher detection gain a sense circuit in read operations.

Figure 3:
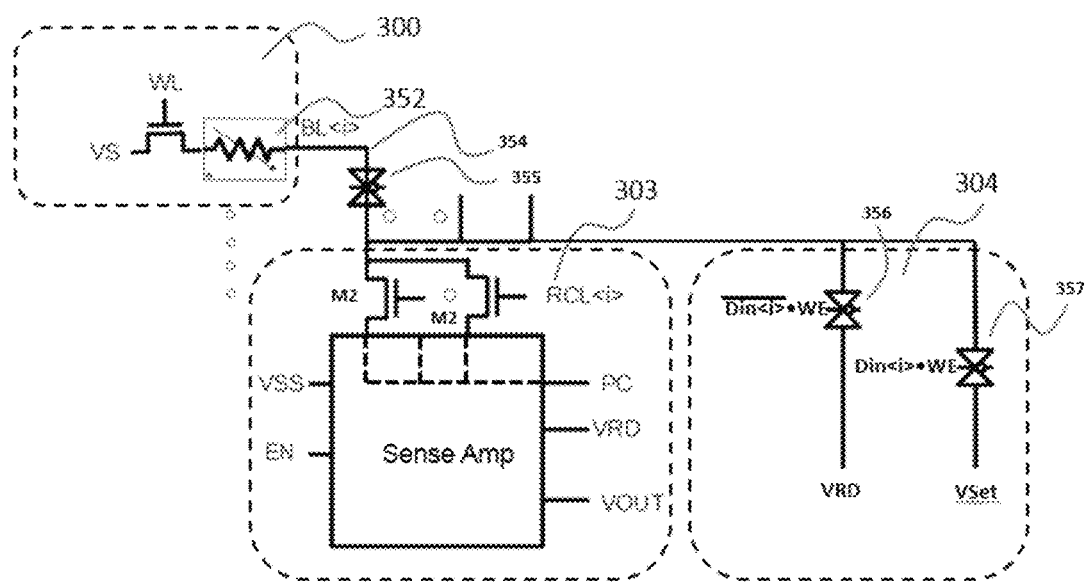
FIG. 3 is a schematic diagram of a sense amplifier according to an embodiment.

FIG. 3 is a schematic diagram of a memory circuit according to an embodiment. A bitcell circuit 300 may comprise one or more memory elements (e.g., non-volatile memory elements) comprising a CES device. In this context, a "bitcell" or "bitcell circuit" as referred to herein comprises a circuit or portion of a circuit capable of representing a value, symbol or parameter as a state. For example, a bitcell may comprise one or more memory devices that capable of representing a value, symbol or parameter as a memory state of the memory device. In particular implementations, a bitcell may represent a value, symbol or parameter as a single bit or multiple bits.

According to an embodiment, bitcell circuit 300 in FIG. 3 may comprise memory elements having a behavior similar to that of the CES device discussed above in connection with FIGS. 1A and 2. In this context, a "bitline" comprises a conductor that is connectable to at least one terminal of a memory element during a write operation to transmit a programming signal altering a memory state of the memory element, or during a read operation to transmit a signal indicative of a current memory state of the memory element. Such a bitline 354 is shown in FIG. 3 as a non-limiting example. Sense amplifier 303 may provide a peripheral read circuit to detect a memory state of CES element 352 in bitcell 300 based on a magnitude of current or voltage from bitline BL through transistor M2 in a read operation. A write driver circuit 304 may comprise CMOS transmission gates 356 and 357 that may be selected in a write operation according to whether the particular write operation a reset operation (e.g., to place CES element 352 in an insulative or high impedance state) or a set operation (e.g., to place CES element 352 in a conductive or low impedance state). For example, transmission gate 356 may connect a voltage signal VRD to bitline 354 (while transmission gate is open) in a reset operation and transmission gate 357 may connect a voltage Vset to bitline 354 (while transmission gate 356 is open) in a set operation. In this embodiment, the voltage signal VRD driving the reset operation may also be applied to sense amplifier 303 as a peripheral circuit supply voltage.

FIG. 3 is a schematic diagram of a sense amplifier 303 according to an embodiment for use in detecting an impedance state of CES 352 in a read operation. In a particular implementation, and as discussed above, sense amplifier 303 may limit a current density in a CES during a read operation to enable application of a read voltage (e.g., $V_{read}$ or $V_{read}'$ as illustrated in FIGS. 5A through 5E) having a magnitude that is equal to or greater than a magnitude of a voltage (e.g., $V_{reset}$ or $V_{reset}'$) applied in a write operation to place CES 352 in a high impedance or insulative state. FIG. 3 shows FET M2 connecting selected bit column 354 to sense amplifier 303 in a read operation. It should be understood, however that these are merely examples of how a CES device may be connected to a sense circuit in a read operation and claimed subject matter is not limited in this respect.

According to an embodiment, in a read operation switch FETs M2 may be closed to pre-charge bitline BL by coupling a pre-charge voltage signal PC to transmission gate 354 while limiting the current to less than the maximum permitted for immunity to inhibit an unintended reset operation. In this context, a "bitline" comprises a conductor that is connectable to at least one terminal of a memory element during a write operation to transmit a programming signal altering a memory state of the memory element, or during a read operation to transmit a signal indicative of a current memory state of the memory element. Sense amplifier 303 may detect a memory state of the memory element in bitcell 300 based on a magnitude of current or voltage from bitline BL through FETs M2 in a read operation. FETs M2 in tandem with devices in transmission gate 355 may limit a current density in CES device 352 during a read operation as discussed above.

According to an embodiment, sense amplifier 303 may receive a supply voltage at a voltage VRD to generate a read signal having a current through FETs M2. It should be apparent that a read signal from a pre-charged bitline having a voltage VRD may apply a voltage across CES device in a read operation as $V_{read}=VRD-V_{drop}-VS$, where $V_{drop}$ is a voltage drop across transmission gate 355 and parallel coupled FETs M2 and VS=0.0V, VRD=0.6V and $V_{drop}=0.4$ V, for example, $V_{read}=0.2$ V. It should be understood that these are merely example operating voltages provided for the purpose of illustrating particular aspects of claimed subject matter, and that claimed subject matter is not limited in this respect.

Figure 4A:
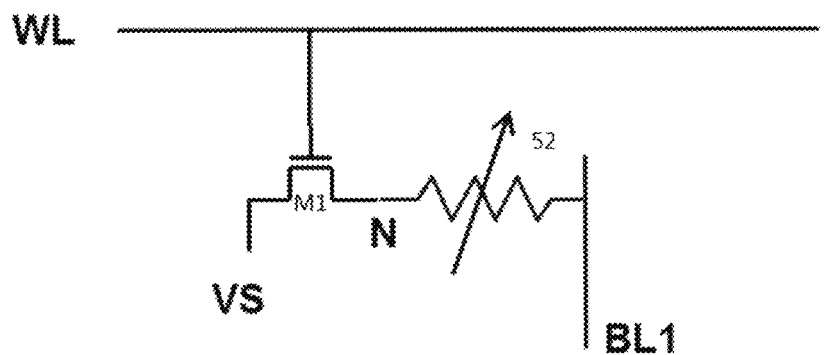
FIGS. 4A and 4B are schematic diagrams of alternative architectures for a bitcell according to particular embodiments.
Figure 4B:
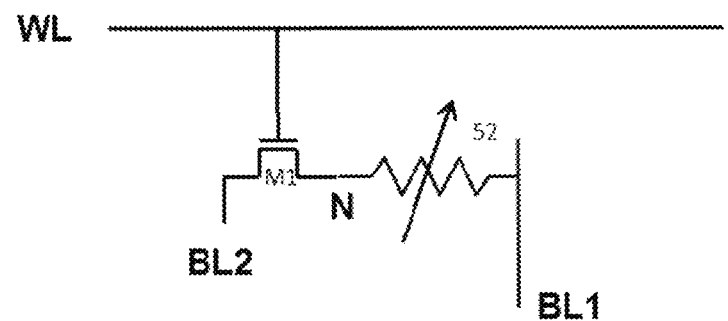

FIGS. 4A and 4B are schematic diagrams directed to specific implementations of a bitcell circuit that include CES elements to maintain a particular impedance state. In one implementation, a CES element may provide a CeRAM device or non-volatile memory element as specific examples of devices in a bitcell capable of maintaining an impedance state, it should be understood that these are merely example implementations. For example, it should be recognized a CES adapted for purposes other than a non-volatile memory device or CeRAM device may be used for storing a particular impedance state (e.g., a conductive or low impedance memory state, or an insulative or high impedance memory state) in a write operation which is detectable in a subsequent read operation, and that claimed subject matter is not limited to either implementation of a CeRAM or non-volatile memory devices.

According to an embodiment, an impedance state of a CES device in a bitcell may be changed or determined based on a particular voltage and current applied to a bitline. For example, providing a signal to bitline BL having a voltage $V_{reset}$ (or $V_{reset}'$) and a sufficient current $I_{reset}$ (or $I_{reset}'$) may place CES device 352 of bitcell 300 in an insulative or high impedance memory state. Likewise, providing a signal to bitline BL having a voltage $V_{set}$ (or $V_{set}'$) and a sufficient current $I_{set}$ (or $I_{set}'$) may place a CES device 352 of bitcell 300 in a conductive or low impedance memory state.

In particular, a write operation is described as a particular process of placing a memory device such as a CES element in a particular impedance state of a plurality of predetermined impedance states by applying a "programming signal" to terminals of the memory device. Particular ones of the predetermined impedance states may correspond to particular voltage levels to be applied to the memory device (e.g., $V_{set}$ or $V_{set}'$ and $V_{reset}$ or $V_{reset}'$). Similarly, particular ones of the predetermined impedance states may correspond to particular current levels to be applied to the memory device (e.g., $I_{set}$ or $I_{set}'$ and $I_{reset}$ or $I_{reset}'$). Accordingly, in a particular embodiment, a programming signal to place a CES device in a particular impedance state in a write operation may be controlled to have a particular voltage level and current level corresponding to the particular impedance state.

In this context, a "conducting element" comprises a circuit element capable of permitting current to pass between two nodes. In a particular implementation, a conducting element may vary a current permitted to pass between nodes based, at least in part, on a particular condition. The particular implementations described below employ FETs as conducting elements to permit current to pass between source and drain terminals based, at least in part, on a voltage applied to a gate terminal. It should be understood, however, that other types of devices such as, a bipolar transistor, diode, variable resistor, etc. may be used as a conducting element, and that claimed subject matter is not limited this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

FIGS. 4A and 4B are schematic diagrams of alternative architectures for a bitcell according to particular embodiments. In a particular implementation, the bitcell architectures of FIGS. 4A and 4B may behave as illustrated in the particular example plot shown in FIG. 2. In a particular implementation of a read operation, a bitline may be connected to a terminal of a CES element through a first conducting element in response to a voltage signal on a wordline. In this context, a "wordline" comprises a conductor for transmitting a signal to select a particular bitcell or group of bitcells to be accessed in a read operation or a write operation. In a particular example implementation, a voltage of a signal on a wordline may be raised or lowered to select or deselect a particular bitcell or group of bitcells to be connected to a corresponding bitline or group of bitlines during a read or write operation. It should be understood, however, that this is merely an example of a wordline and that claimed subject matter is not limited in this respect.

In one aspect of the particular embodiment of FIG. 4A, a CES element 52 may be connected to a FET M1 at a first terminal and a bitline BL1 at a second terminal. In response to a wordline voltage applied to a gate terminal of FET M1, FET M1 may connect the first terminal of CES element 52 to a voltage source VS during read or write operations. In another implementation as shown in FIG. 4B, bitlines BL1 and BL2 may comprise complementary bitlines to apply an appropriate voltage (e.g., $V_{set}$, $V_{set}'$, $V_{reset}$ or $V_{reset}'$ as shown in FIG. 2) and current (e.g., $I_{set}$, $I_{set}'$, $I_{reset}$ or $I_{reset}'$) or $I_{reset}$ as shown in FIG. 2) across first and second terminals of CES element 52 in a write operation to place CES 52 in a desired impedance state, or to apply an appropriate voltage (e.g., $V_{read}$ or $V_{read}'$) in a read operation to detect a current impedance state. In this particular example implementation, BL1 may be connected to a write driver circuit (not shown) through an additional conducting element (not shown) in response to a wordline signal voltage.

As pointed out above, a write circuit may independently control a voltage and a current of a signal applied to CES element 52 in a write operation based, at least in part, on whether the write operation is to place CES element 52 in a conductive or low impedance memory state (e.g., in a set operation), or an insulative or high impedance memory state (e.g., in a reset operation). For example, and as depicted in FIG. 2, for a write operation to place CES element 52 in a conductive or low impedance memory state, a signal having a voltage $V_{set}$ and current $I_{set}$, or voltage $V_{set}'$ and current $I_{set}'$ may be applied. Likewise, for a write operation to place CES element 52 in an insulative or high impedance state, a signal having a voltage $V_{reset}$ and current $I_{reset}$, or voltage $V_{reset}'$ and current $I_{reset}'$ may be applied. As illustrated in FIG. 1, voltage $V_{set}$ may have a greater magnitude than voltage $V_{reset}$ while current $I_{set}$ may have a smaller magnitude than current $I_{reset}$. In a particular implementation, a write circuit (not shown) may independently control voltage and current to provide a signal to a bitline to place a non-volatile memory device in a conductive or low impedance memory state, or an insulative or high impedance state.

In the embodiment of FIG. 4A, to detect a current impedance state of CES element 52, FET M1 may connect voltage source VS and/or other peripheral read circuitry to node N to apply a read voltage $V_{read}$ or $V_{read}'$ across first and second terminals of CES 52 in a read operation. While read voltage $V_{read}$ or $V_{read}'$ is applied, a current flowing through bitline BL1 may then be sensed (e.g., at sense amplifier 303) to detect a current impedance state of CES element 52. According to an embodiment, a magnitude of a current flowing through terminals of CES element 52 during a read operation may be limited to less than the magnitude of $I_{reset}$ or $I_{reset}'$. This may prevent an unintended transition of a current state of CES element 52 in a conductive or low impedance memory state to an insulative or high impedance memory state during a read operation. Additionally, controlling a magnitude of current during a read operation may enable a magnitude of $V_{read}$ to be greater than or equal to a magnitude of $V_{reset}$ or $V_{reset}'$. In a particular implementation, by setting $|V_{read}| \approx |V_{reset}|$ or $|V_{read}| \approx |V_{reset}'|$, circuitry at voltage source VS to generate a read signal and a programming signal to place CES element 52 in a high impedance or insulative state may be simplified as peripheral circuitry to generate the read signal (e.g., apply a voltage at a controlled current) and a write driver circuit to generate a programming signal for a reset operation may share circuitry for generating signals at a particular voltage.

Current flowing through terminals of CES element 52 during a read operation may be controlled, for example, by controlling a current applied to a bitline by a sense amplifier (e.g., sense amplifier 303). Alternatively, current flowing through terminals of CES element 52 during a read operation may be controlled by controlling a voltage applied to a gate of FET M1 during read operations. In the particular implementations of FIGS. 4A and 4B, FET M1 is configured as an NFET. FET M1 may be configured as a PFET in alternative implementations. In the presently illustrated embodiment, a boosted wordline voltage signal WL may be applied during a write operation to permit sufficient current flowing through CES element 52 to place CES element 52 in a particular impedance state. A voltage of wordline voltage signal WL may then be lowered during read operations to limit current flowing through CES element 52. Alternatively, voltage source VS applying a read voltage may limit a current flowing to bitline BL1 during a read operation.

Figure 5A:
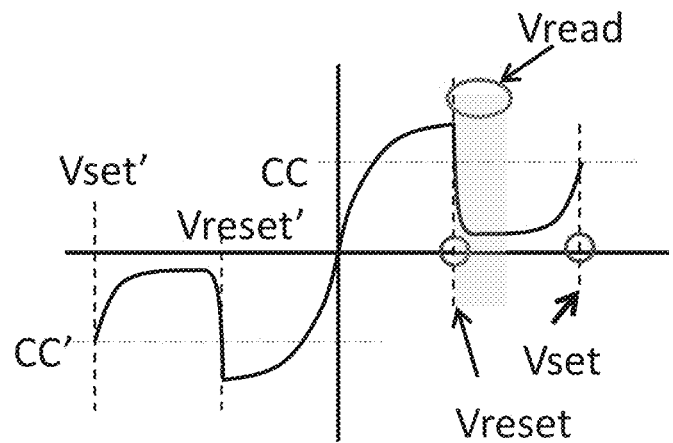
FIGS. 5A through 5E are plots illustrating read and write operations performed on CES devices according to particular embodiments.

According to an embodiment, CES element 52 may have properties of a CES as illustrated in FIG. 2 enabling write operations from bipolar programming signals, and/or read operations from a read signal having a polarity that is opposite a polarity of at least one programming signal for a write operation. Table 2 below illustrates example voltages for read and write operations for the bitcell of FIG. 4A. As shown in FIGS. 5A through 5E, a current in CES element 52 may be limited during read operations so as to enable a magnitude of a voltage of a read signal to be equal or greater than a magnitude of a voltage to place CES element in a high impedance or insulative state in a write operation. As shown in FIG. 5A, signals applied to terminals of CES element 52 according to Table 2 occur in one polarity (e.g., first quadrant). Wordline signal WL may be lowered to 0.0V if no read or write operation is occurring.

TABLE 2

| Operation | WL | BL1 | VS |
| --- | --- | --- | --- |
| Read | 1.2 V | 0.6 V-$V_{drop}$ | 0.0 V |
| Reset | 1.2 V | 0.6 V | 0.0 V |
| Set | 1.2 V | 1.2 V | 0.0 V |

In an embodiment, the same supply voltage may be used for read operations and reset operations (e.g., shown as 0.6 V in the particular example of Table 2). It may be observed, however, that BL1 is maintained at a lower voltage during a read operation because of a voltage drop over conducting elements (e.g., FETs M2 and transmission gate 355 as shown in FIG. 3) connecting the supply voltage to pre-charge the bitline during read operations.

Figure 5B:
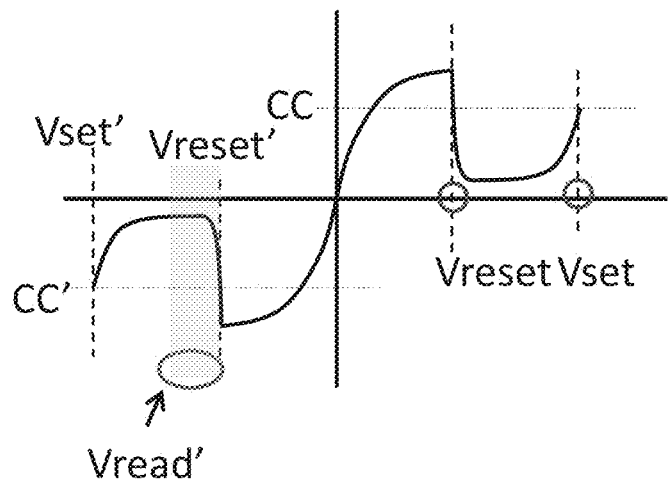

Table 3 below illustrates example voltages for read and write operations for the bitcell of FIG. 4A having the same polarity as illustrated in FIG. 5B. Here, signals applied to terminals of CES element 52 also occur in one polarity (e.g., third quadrant). In the embodiment of Table 3, a wordline voltage applied to a gate of FET M1 may be boosted from 1.2V to 1.8V to bias FET M1 to enable reverse flow of current without a voltage drop across FET M1.

TABLE 3

| Operation | WL | BL1 | VS |
| --- | --- | --- | --- |
| Read | 1.8 V | $V_{drop}$ | 0.6 V* |
| Reset | 1.8 V | 0.0 V | 0.6 V |
| Set | 1.8 V | 0.0 V | 1.2 V |

Again, in the particular implementations of Tables 2 and 3, and FIGS. 5A and 5B a supply voltage of the sense amplifier 303 in FIG. 3 may be the same as the supply voltage used for generating a programming signal applied across CES element 352 in a reset operation. As pointed out above, application of the same supply voltage in a read operation or a reset operation may be enabled by limiting a current density in CES element 352 to avoid a change in impedance state of CES element 352 in the read operation. This simplifies the array design by eliminating a dedicated power supply for read operations and permits simpler circuitry to generate a read signal from a peripheral read circuit and circuitry to generate a programming signal at a write driver when they are driven by the same supply voltage. Furthermore, permitting higher voltage of a read signal during read operations may permit an increased gain for detection of an impedance state in a sense circuit, for example.

Figure 5C:
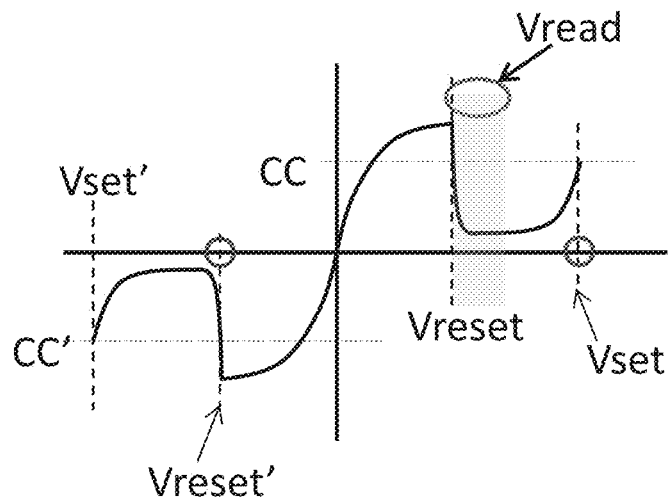

In both the embodiments of Tables 4 and 5, a read signal applied to terminals of CES element 52 of the bitcell of FIG. 4A for read operations has a voltage polarity which is opposite a polarity of voltages of programming signals applied during write operations. FIG. 5C illustrates a read signal and programming signals applied to CES element 52 according to Table 4, which shows a voltage of a read signal $V_{read}$ in a read operation occurring in a first quadrant. Voltages for programming signals $V_{set}'$ and $V_{reset}'$ in write operations occur in a third quadrant.

TABLE 4

| Operation | WL | BL1 | VS |
| --- | --- | --- | --- |
| Read | 1.2 V | 0.6 V-$V_{drop}$ | 0.0 V |
| Reset | 1.8 V | 0.0 V | 0.6 V |
| Set | 1.8 V | 0.0 V | 1.2 V |

Figure 5D:
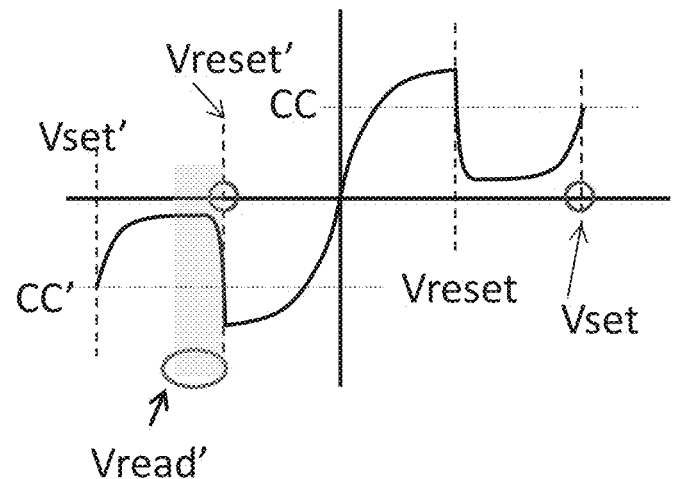

Similarly, FIG. 5D illustrates a read signal and programming signals applied to CES element 52 according to Table 5, which shows a voltage of a read signal $V_{read}'$ in a read operation occurring in a third quadrant. Voltages for programming signals $V_{set}$ and $V_{reset}$ in write operations occur in a first quadrant.

TABLE 5

| Operation | WL | BL1 | VS |
| --- | --- | --- | --- |
| Read | 1.2 V | $V_{drop}$ | 0.6 V |
| Reset | 1.2 V | 0.6 V | 0.0 V |
| Set | 1.2 V | 1.2 V | 0.0 V |

As pointed out above, having a read signal voltage with a polarity that is opposite a polarity of programming signal voltages, as discussed above in connection with embodiments of Tables 4 and 5 and FIGS. 5C and 5D, allows for a reverse current through CES element 52 in read operations which may extend durability of the CES element.

Figure 5E:
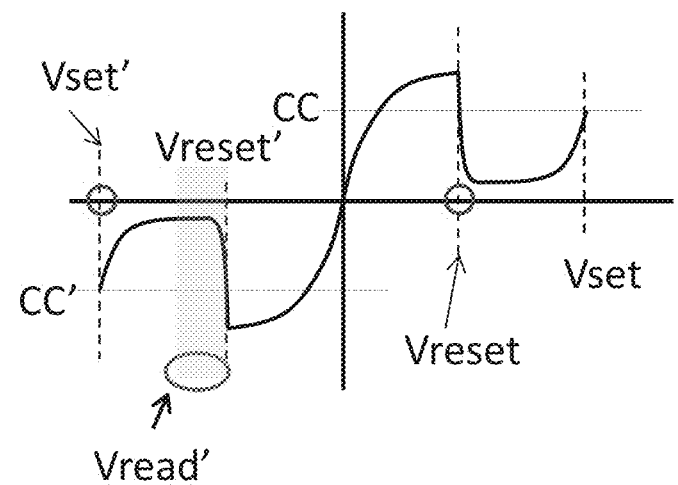

Similarly, FIG. 5E illustrates a read signal and programming signals applied to CES element 52 in the bitcell of FIG. 4B according to voltages shown in Table 7. Here, a read signal having a voltage $V_{read}'$ and a first programming signal to place CES element 52 in a low impedance or conductive state having a voltage $V_{set}'$ occur in the third quadrant. A second programming signal to place CES element 52 in a low impedance or conductive state having a voltage $V_{reset}$, on the other hand has a polarity opposite polarities of the read signal and the first programming signal to occur in the first quadrant.

TABLE 6

| Operation | WL | BL1 | BL2 |
| --- | --- | --- | --- |
| Read | 1.2 V | $V_{drop}$ | 0.6 V |
| Reset | 1.2 V | 0.6 V | 0.0 V |
| Set | 1.2 V | 0.0 V | 1.2 V |

In the particular implementations discussed above in FIGS. 5C through 5E and Tables 4 through 6, three operations applied to CES element 52 are described in which either a read signal or a programming signal is applied to terminals of CES element 52. For these example cases, one of the operations applies a read signal or programming signal having a polarity that is opposite to the other two operations. This may allow for a reverse current through CES element 52 in read operations which may extend durability of CES element 52. Also, in the particular implementations of FIGS. 5C, 5D 5E and Tables 4, 5 & 6, programming signals for set and reset operations have voltages with opposite polarities which, as discussed above, increases the write margin of $|V_{set}|-|V_{reset}|$ (or $|V_{set}'|-|V_{reset}'|$) to $|V_{set}|+|V_{reset}|$ (or $|V_{set}'|+|V_{reset}'|$).

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A device comprising:
a correlated electron switch (CES) element comprising a first terminal and a second terminal;
a driver circuit configured to apply a first programming signal across the first and second terminals to place the CES element in a conductive or low impedance state, and configured to apply a second programming signal across the first and second terminals to place the CES element in an insulative or high impedance state, wherein the first programming signal comprises a first voltage and a first current, and the second programming signals comprises a second voltage and a second current, and wherein the first and second voltages have opposite polarity, and the first and second currents have opposite polarity; and
a peripheral read circuit configured to apply a third voltage as a supply voltage during a read operation, and wherein a magnitude of the third voltage is equal to or greater than to a magnitude of the second voltage, wherein the peripheral read circuit is further configured to limit a current density in the CES element so as to prevent the CES element from transitioning from the conductive or low impedance state to the insulative or high impedance state during the read operation.

2. The device of claim 1, wherein a write margin of CES element in the device is about a magnitude of the first voltage added to a magnitude of the second voltage.

3. The device of claim 1, wherein current flows between the first and second terminals in a first direction between the first and second terminals responsive to application of the first programming signal, and wherein current flows between the first and second terminals in a second direction opposite the first direction responsive to application of the second programming signal.

4. The device of claim 1, wherein the CES element comprises a CeRAM element.

5. A device comprising:
a correlated electron switch (CES) element comprising a first terminal and a second terminal;
a peripheral read circuit configured to supply a first voltage in a read operation;
a driver circuit to apply a second voltage across the first and second terminals of the CES element in a first write operation to place the CES element in an insulative or high impedance state, wherein a magnitude of the first voltage is equal to or greater than a magnitude of the second voltage; and
a current control circuit to limit a current density in the CES element while the first voltage is applied by the peripheral read circuit during the read operation so as to prevent the CES element from transitioning from the conductive or low impedance state to the insulative or high impedance state during the read operation.

6. The device of claim 5, wherein the driver circuit is configured to apply a third voltage across the first and second terminals in a second write operation, wherein the third voltage has a polarity opposite to a polarity of the second voltage.

7. The device of claim 6, wherein a write margin of CES element in the device is about a magnitude of the second voltage added to a magnitude of the third voltage.

8. The device of claim 6, wherein current flows between the first and second terminals in a first direction between the first and second terminals during the first write operation, and wherein current flows between the first and second terminals in a second direction opposite the first direction during the second write operation.

9. The device of claim 5, wherein the driver circuit is configured to apply a third voltage across the first and second terminals in a second write operation, wherein the second voltage and the third voltage have a polarity opposite to a polarity of the first voltage.

10. The device of claim 9, wherein current flows between the first and second terminals in a first direction between the first and second terminals during the read operation, and wherein current flows between the first and second terminals in a second direction opposite the first direction during the first write operation and the second write operation.

11. The device of claim 5, wherein the CES element comprises a correlated electron random access memory (CeRAM) element.

12. A device comprising:
a correlated electron switch (CES) element comprising a first terminal and a second terminal;
a peripheral read circuit configured to apply a first voltage in a read operation; and
a driver circuit to apply a second voltage across the first and second terminals of the CES element in a first write operation to place the CES element in an insulative or high impedance state, and apply a third voltage across the first and second terminals in a second write operation to place the CES element in a conductive or low impedance state, wherein a polarity of the first voltage is opposite to polarities of the second and third voltages, wherein the peripheral read circuit is further configured to limit a current density in the CES element so as to prevent the CES element from transitioning from the conductive or low impedance state to the insulative or high impedance state during the read operation.

13. The device of claim 12, wherein current flows between the first and second terminals in a first direction between the first and second terminals during the read operation, and wherein current flows between the first and second terminals in a second direction opposite the first direction during the first write operation and the second write operation.

14. The device of claim 12, wherein a magnitude of the first voltage is equal to or greater than a magnitude of the second voltage.

15. The device of claim 12, wherein the CES element comprises a correlated electron random access memory (CeRAM) element.

* * * * *